(12) United States Patent
Hashimoto

(10) Patent No.: US 7,138,819 B2
(45) Date of Patent: Nov. 21, 2006

(54) DIFFERENTIAL VOLTAGE MEASURING APPARATUS AND SEMICONDUCTOR TESTING APPARATUS

(75) Inventor: Yoshihiro Hashimoto, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/517,349

(22) PCT Filed: Jun. 12, 2003

(86) PCT No.: PCT/JP03/07465

§ 371 (c)(1),
(2), (4) Date: Jun. 15, 2005

(65) Prior Publication Data

US 2006/0038578 A1 Feb. 23, 2006

(30) Foreign Application Priority Data

Jun. 13, 2002 (JP) .............................. 2002-172556

(51) Int. Cl.
*G01R 31/26* (2006.01)

(52) U.S. Cl. ...................................... 324/765

(58) Field of Classification Search ...................... None
See application file for complete search history.

(56) References Cited

U.S. PATENT DOCUMENTS 6,255,839 B1 7/2001 Hashimoto
6,992,490 B1 * 1/2006 Nomoto et al. ............. 324/522
7,046,180 B1 * 5/2006 Jongsma et al. ............ 341/141

FOREIGN PATENT DOCUMENTS

| JP | 61-68533 | 5/1986 |
|---|---|---|
| JP | 2-58840 | 4/1990 |
| JP | 04-370769 | 12/1992 |
| JP | 06-034674 | 2/1994 |
| JP | 09-236637 | 9/1997 |
| JP | 11-174113 | 7/1999 |
| JP | 2001-007660 | 1/2001 |
| JP | 2001-036359 | 2/2001 |

\* cited by examiner

*Primary Examiner*—Minh Nhut Tang
*Assistant Examiner*—Trung Q Nguyen
(74) *Attorney, Agent, or Firm*—Muramatsu & Associates

(57) ABSTRACT

There is provided a semiconductor testing apparatus comprising a current measuring portion which converts a load current quantity at the time of application of a relatively high test voltage to a DUT to fall within a low-voltage range, and then subjects the low-voltage range to quantization conversion with a predetermined measurement resolution even when the relatively high test voltage is applied to the DUT. This is a differential voltage measuring apparatus comprising: an applied voltage source which applies a predetermined constant voltage to a load device; current/voltage converting means for directly inserting a predetermined resistance between an output end of the applied voltage source and the load device, and converts a quantity of a current flowing through the load device into a voltage; and current measuring means which switches and receives a common mode voltage and a detection voltage in time series, shifts the received voltages to predetermined low voltages, and outputs low-voltage measurement data obtained by receiving each of the shifted voltages and subjecting this voltage to quantization conversion.

9 Claims, 10 Drawing Sheets

DIFFERENTIAL VOLTAGE MEASURING APPARATUS AND SEMICONDUCTOR TESTING APPARATUS

CROSS-REFERENCE TO RELATED APPLICATION

This application is a 371 of PCT/JP03/07465 filed Jun. 6, 2003, which is incorporate herein by reference in its entirety.

TECHNICAL FIELD

The present invention relates to a semiconductor testing apparatus comprising a current measuring portion which can apply a relatively high test voltage to a device under test (DUT) and subject a load current quantity in this application to quantization conversion with a predetermined measurement resolution. More particularly, the present invention relates to a semiconductor testing apparatus comprising a voltage source and current measurement (VSIM) which has a current measuring portion which can perform quantization conversion with a predetermined measurement resolution without being dependent on a high test voltage which is applied to a DUT.

BACKGROUND ART

In case of highly accurately measuring a direct-current voltage or a direct current of a device under test (DUT) by a semiconductor testing apparatus, each accurate component is required in an operational amplifier, a peripheral resistance, an AD converter and others.

When mounting these circuits on a silicon substrate, there is a problem that a manufacturing process of the silicon substrate becomes complicated, laser trimming is required or a chip size is increased in order to realize highly accurate measurement.

FIG. 1 is a circuit configuration view of a primary part of one channel, showing a voltage source and current measurement (VSIM) which applies a desired voltage to a DUT and measures a current flowing at this moment. This measures a quantity of a current which breaks in an IC pin of the DUT through pin electronics of a test head and flows through the IC pin.

As well known, in a VSIM for a high voltage, a voltage up to, e.g., approximately ±40 V is applied to a DUT, and a current measurement range is switched in order to measure a current quantity in a wide dynamic range of pico-ampere/micro-ampere/mill-ampere. In a VSIM for a low voltage, a voltage up to, e.g., approximately ±10 V is applied to a DUT, and a current measurement range is switched in order to measure a current quantity of micro-ampere/milli-ampere. It is to be noted that a semiconductor testing apparatus include a predetermined number of these VSIMs. Here, since the semiconductor testing apparatus and the voltage source and current measurement (VSIM) are publicly and technically known, any other signals or constituent elements and their detailed explanation will be eliminated except the primary part according to the present invention.

As shown in FIG. 1(a), as simple primary constituent elements of a VSIM, there are included a DA converter 10, an operational amplifier A1, a current detection resisting means RM and a current measuring portion 100.

The DA converter 10 generates a positive/negative set voltage 10s which should be applied to an IC pin of a DUT. For example, it generates an arbitrary voltage which is not less than ±40 V.

The operational amplifier A1 is an operational amplifier for error reduction and power increase which receives the set voltage 10s and supplies it as a test voltage VS to the IC pin of the DUT through the current detection resisting means RM.

The current detection resisting means RM is inserted in series into a line connected with the IC pin of the DUT, and a resistance value with which a quantity of a current flowing through this line is converted into a potential difference Vx of approximately several-hundred milli-volt is used. A common mode voltage Va and a detection voltage Vb which are generated at each of both ends of the current detection resisting means RM are supplied to the current measuring portion 100. In this example, as to the current detection resisting means RM, there are a case in which the current detection resisting means RM is constituted by using a single resistance alone and a case in which a current measurement range function formed of a plurality of resistances and a switching relay is included as shown in FIG. 1(c) because of a measurement range or any other reason.

The current measuring portion 100 receives the common mode voltage. Va and the detection voltage Vb at the both ends of the current detection resisting means RM, performs quantization conversion, obtains a result as measurement data of a potential difference Vx between these voltages, and specifies a quantity of the current flowing through the IC pin of the DUT based on this data.

FIG. 1(b) is a first internal fundamental circuit diagram of the current measuring portion. This is an example in which operational amplifiers A2 and A3, resistances R1, R2, R3 and R4, a changeover switch SW1 and an AD converter 20 are provided as constituent elements.

A structure of the operational amplifier A3 and the resistances R1, R2, R3 and R4 is a general differential amplification structure which receives two signals, converts them into a differential signal Vc corresponding to a potential difference Vx between these signals, and outputs the obtained signal. The operational amplifier A2 is just a voltage buffer. In this example, when performing accurate measurement, a voltage division ratio of the resistances R1 and R2 and a voltage division ratio of the resistances R3 and R4 must precisely match with each other.

The changeover switch SW1 is a switching relay which is used when a connection is switched to a circuit earth side and 0 V as a reference is measured in order to specify an offset voltage or the like of the operational amplifiers A2 and A3.

The AD converter 20 receives a differential signal Vc from the operational amplifier A3, and outputs measurement data obtained by quantization conversion of the received signal.

Error factors involved by the common mode voltage and the voltage division resistances will now be evaluated by using numerical expressions. Here, $\alpha$ is an error rate with respect to a target resistance value, and n is a gain (an amplification degree).

Error factors of the respective resistances can be regarded as $R1=R(1+\alpha)$, $R2=n*R(1-\alpha)$, $R3=R(1-\alpha)$, and $R4=n*R(1+\alpha)$.

An offset=Ao is assumed as an error factor of the operational amplifier A2, and an offset=Bo is assumed as an error factor of the operational amplifier A3.

The differential signal Vc to be outputted can be represented by an expression $Vc=Va*(R4/(R3+R4))*((R1+R2)/R1)-Vb*(R2/R1)-Ao*(R2/R1)+Bo*((R1+R2)/R1)$.

In this example, when Vb=Va+Vx is substituted, there can be obtained an expression Vc=Va*[(R4/(R3+R4))*((R1+R2)/R1)−(R2/R1)]−Vx*(R2/R1)−Ao*(R2/R1)+Bo*(R2/R1+1).

A common mode voltage error n1 can be represented by an expression n1=[(R4/(R3+R4))*(R1+R2)/R1]−(R2/R1)].

A gain error n2 can be represented by an expression n2=(R2/R1).

An offset error n3 can be represented by an expression n3=Ao*(R2/R1)+Bo*((R1+R2)/R1).

When the common voltage error n1 is calculated based on the above-described expressions, there can be obtained an expression n1={n(1+α)/[(1−α)+n((1+α))]*{[(1+α)+n((1−α))/(1+α)]−[n(1−α)/(1+α)].

Here, when 1−α=A and 1+α=B are substituted, there can be obtained an expression n1=(B+nA)/(A+nB)−A/B=(A*A−B*B)/(AB−nB*B)=[1−2α+α*α−(1+2α+α*α)]/[1−α*α+n(1+2α+α*α)].

Here, since α<<1 is achieved and α*α and 2αn are sufficiently smaller than 1 so that they can be approximated by 0, there can be generated a common mode voltage error represented as n1'=−4α/(1+n+2αn)≈4α/(1+n). For example, when numerical values of a common mode voltage Va=10 V, a resistance error α=0.1% and a gain n=1 are substituted, the common mode voltage error takes a value of 10 V*(4*0.1%)/2=20 mV. There is a problem that this error value results in a serious measurement error factor.

On the other hand, the resistance has peculiar non-linear characteristics of a resistance element called a voltage coefficient. In the peculiar non-linear characteristics, a resistance value varies depending on a voltage which is applied to the resistance as shown in an explanatory view of FIG. 10 in which a non-linear deviation is generated with respect to an ideal resistance due to an applied voltage.

For example, although a highly accurate resistance using a nickel-chrome-based thin film or the like has a small voltage coefficient, a polysilicon-based resistance formed in an monolithic IC may have a voltage coefficient which varies 0.1 to 0.5% with 1 V in some cases.

Therefore, since the resistances R1 to R4 for voltage division complicatedly vary due to the common mode voltage Va as well as the potential difference Vx of Va−Vb in the above-described circuit, there is a problem that resistances with good characteristics which are formed of nickel chrome or the like are required. On the contrary, when a voltage to be applied to the resistances is in proportion to the differential signal Vc as a measurement value, the peculiar non-linear characteristics of the resistance elements can be corrected by calibration or the like.

FIG. 2(b) is a second internal fundamental circuit diagram of the current measuring portion 102, which is a primary fundamental structure of the current measuring portion which measures a current of the IC pin of the DUT in each of a plurality of channels disclosed in Japanese Patent Application Laid-open No. 174113-1999 (a voltage source and current measuring circuit of an IC tester). Here, FIG. 2(a) shows a primary fundamental structural example when a current flowing through the IC pin of one channel is measured. This is a technique which directly AD-converts each of the common mode voltage Va and the detection voltage Vb at both ends, stores them in a data memory, and then calculates a potential difference Vx by software processing. According to this technique, since the resistances R1 to R4 for voltage division are not used, the problem of the common mode voltage error is solved.

However, there is adversely a problem that an AD converter having a high-input voltage range and a high resolution is required for-the AD converter 45. For example, in cases where measurement is carried out with a resolution of ±0.1% (±1000) when the potential difference Vx is 1 Vmax, a 11-bit resolution (±1000) can suffice if a test voltage VS is 1 V. However, there is a problem that an AD converter having a high-input voltage range with a 15-bit resolution (±10000) is required if the test voltage VS is 10 V and an AD converter having a high-input voltage range with an 18-bit resolution (±100000) is required if the test voltage VS is 100 V. There is a drawback that an AD converter which can cope with a high-input voltage range and a high resolution is expensive.

As described above, in the current measuring portion according to the prior art, as shown in FIG. 2, the common mode voltage Va and the detection voltage Vb at the both ends of the current detection resisting means RM are directly subjected to quantization conversion by the AD converter, and hence there is a problem that an AD converter having a high-input voltage range and a high resolution is required. An AD converter which can cope with a high-input voltage range is expensive. The semiconductor testing apparatus must include such AD converters for several-ten channels, which results in a problem that the testing apparatus becomes expensive.

It is, therefore, an object of the present invention to provide a semiconductor testing apparatus comprising a current measuring portion which converts a load current quantity at the time of application of a relatively-high test voltage to fall within a low-voltage range and then subjects the low-voltage range to quantization conversion with a predetermined measurement resolution even when the relatively high test voltage is applied to a DUT.

Further, it is another object of the present invention to provide a semiconductor testing apparatus comprising a voltage source and current measurement (VSIM) having a current measuring portion which can convert a load current quantity at the time of application of a relatively high test voltage to fall within a relatively low voltage range and then subject the relatively low voltage range to quantization conversion with a predetermined measurement resolution even when the relatively high test voltage is applied to a DUT.

Furthermore, it is still another object of the present invention is to provide a semiconductor testing apparatus comprising a current measuring portion having a circuit configuration which can minimize an impact on a measurement accuracy even if there are irregularities in resistances formed on an IC when forming the current measuring portion as a monolithic IC.

Moreover, it is yet another object of the present invention to provide a semiconductor testing apparatus comprising a current measuring portion having a circuit configuration which can minimize an impact on a measurement accuracy by performing linear correction processing even if peculiar non-linear characteristics of resistance elements formed on an IC exist when forming the current measuring portion as a monolithic IC.

DISCLOSURE OF THE INVENTION

Solution means according to the present invention will now be described.

First solution means will be explained. Here, FIGS. 9 and 1(a) show the solution means according to the present invention.

In order to solve the above-described problems, there is provided a differential voltage measuring apparatus characterized by comprising:

an applied voltage source (e.g., a DA converter 10 and an operational amplifier A1) which applies a predetermined constant voltage to a load device (e.g., a DUT);

current/voltage converting means (e.g., current detection resisting means RM) for directly inserting a predetermined resistance between an output end of the applied voltage source and the load device, and converting a quantity of a current flowing through the load device into a voltage;

when a voltage at the output end of the applied voltage source is referred to as a common mode voltage Va, a voltage applied to the load device through the current/voltage converting means is referred to as a detection voltage Vb, and a difference between the both voltages is referred to as a potential difference Vx, current measuring means (e.g., a current measuring portion 200) for switching and receiving the common mode voltage Va and the detection voltage Vb in time series, shifting each voltage to a predetermined low voltage in the vicinity of 0 V, and outputting low-voltage measurement data obtained by receiving and subjecting each shifted voltage to quantization conversion; and calculating means for obtaining a difference value in voltage between the both obtained low-voltage measurement data as a potential difference Vx, and determining a result value acquired by multiplying the obtained potential difference Vx and a resistance value of the current/voltage converting means as a quantity of the current flowing through the load device, wherein an AD converter 60 having a low resolution can be applied in the current measuring means.

Second solution means will now be described. Here, FIGS. 9 and 1(*a*) show the solution means according to the present invention.

In order to solve the above-described problems, there is provided a semiconductor testing apparatus including a function of a voltage source and current measurement (VSIM) which breaks in a tester pin of a device under test, applies a predetermined direct-current voltage to an IC pin of the DUT and measures a current flowing at this moment, characterized by comprising:

an applied voltage source (e.g., a DA converter 10 and an operational amplifier A1) which applies a predetermined constant voltage to the DUT;

current/voltage converting means for directly inserting a predetermined resistance between an output end of the applied voltage source and the IC pin of the DUT, and converting a quantity of a current flowing through the DUT into a voltage;

when a voltage at the output end of the applied voltage source is referred to as a common mode voltage Va, a voltage applied to the DUT through the current/voltage converting means is referred to as a detection voltage Vb, and a difference between the both voltages is referred to as a potential difference Vx, current measuring means (e.g., a current measuring portion 200) for switching and receiving the common mode voltage Va and the detection voltage Vb in time series, shifting each voltage to a low voltage in the vicinity of 0 V, and outputting low-voltage measurement data obtained by receiving and subjecting each shifted voltage to quantization conversion; and calculating means for acquiring a difference value in voltage between the both obtained low-voltage measurement data as a potential difference Vx, and determining a result value acquired by multiplying the obtained potential difference Vx by a resistance value of the current/voltage converting means as a quantity of the current flowing through the DUT, wherein an AD converter 60 having a low resolution can be applied in the current measuring means.

Third solution means will now be described. Here, FIG. 1(*a*) shows the solution means according to the present invention.

There is provided the above-described semiconductor testing apparatus characterized in that, one embodiment of the applied voltage source comprises a first DA converter 10 and a first operational amplifier A1, the first DA converter 10 generates a predetermined reference voltage (a set voltage 10*s*) based on set data which is set from the outside, the first operational amplifier A1 is an operational amplifier for a power, receives the reference voltage at a positive input end thereof (a non-reversal input end), receives a test voltage VS which is supplied to a DUT at a negative input end thereof (a reversal input end), and supplies the voltage as the test voltage VS from an output end of the first operational amplifier A1 to the DUT through the current/voltage converting means, and the voltages are supplied as a common mode voltage Va and a detection voltage Vb from both ends of the current/voltage converting means connected with the output end of the first operational amplifier A1 to first current measuring means (e.g., a current measuring portion 200).

Fourth solution means will now be described. Here, FIG. 5 shows the solution means according to the present invention.

There is provided the semiconductor testing apparatus characterized in that one embodiment of the applied voltage source further supplies the reference voltage generated by the first DA converter 10 to the second current measuring means.

Fifth solution means will now be described. Here, FIG. 7 shows the solution means according to the present invention.

There is provided the semiconductor testing apparatus characterized in that, one embodiment of the applied voltage source comprises a first DA converter 10 and a reversal amplification buffering means 80, the first DA converter 10 generates a predetermined reference voltage (a set voltage 10*s*) based on set data which is set from the outside, the reversal amplification buffering means 80 is a reversal type operational amplifier for a power, receives the reference voltage, receives a test voltage VS which is supplied to a DUT and subjects this voltage to reversal amplification with a desired gain, supplies the obtained voltage as the test voltage VS from an output end of the reversal amplification buffering means 80 to the DUT through the current/voltage converting means, and voltages are supplied as a common mode voltage va and a detection voltage Vb from both ends of the current/voltage converting means connected with the an output end of the first operational amplifier A1 to the third current measuring means, and the reference voltage generated by the first DA converter is supplied to the third current measuring means (a current measuring portion 20*b*).

Sixth solution means will now be described. Here, FIGS. 3(*a*) and (*b*), FIGS. 5(*b*) and (*c*) and FIGS. 7(*b*) and (*c*) show the solution means according to the present invention.

There is provided the semiconductor testing apparatus characterized in that, one embodiment of the first to third current measuring means comprises offset voltage giving means, an AD converter 60 and data storing means, the offset voltage giving means (e.g., an offset voltage giving circuit 300) switches and receives a common ode voltage Va and a detection voltage Vb which are substantially known positive voltages or negative voltages in time series, and outputs a first low-voltage signal corresponding to the common mode voltage Va and a second low-voltage signal corresponding to the detection voltage Vb which are obtained by voltage shifting so that the shifted voltage falls within a predetermined low-voltage range, the AD converter 60 receives the first low-voltage signal and the second low-voltage signal obtained by shifting each voltage to the low voltage in time series, and outputs first measurement data and second measurement data obtained by subjecting each signal to quantization conversion, and the data storing means (e.g., a data memory 46) is a memory or a register capable of storing at least one set of the first measurement data and the second measurement data.

Seventh solution means will now be described. Here, FIGS. 3(a), 5(b) and 7(b) show the solution means according to the present invention.

There is provided the semiconductor testing apparatus characterized in that one embodiment of the first current measuring means comprises first input signal switching means (e.g., a changeover switch SW1) which receives a common mode voltage Va and a detection voltage Vb of one system which are input to the current measuring means, switches to one of these voltages and supplies the switched voltage to the offset voltage giving means.

Eighth solution means will now be described. Here, FIG. 3(b) shows the solution means according to the present invention.

There is provided the semiconductor testing apparatus characterized in that one embodiment of the second current measuring means comprises second input signal switching means (e.g., a changeover switch SW1 and a changeover switch SW2) which receives a plurality of groups of input signals each indicating a set a common mode voltage Va and a detection signal Vb from a plurality of channels, switches to one of the plurality of groups, and supplies the switched group to the offset voltage giving means.

Ninth solution means will now be described. Here, FIGS. 5(c) and 7(c) show the solution means according to the present invention.

There is provided the semiconductor testing apparatus characterized in that one embodiment of the third current measuring means comprises third input signal switching means (e.g., a changeover switch SW1, a changeover switch SW2 and a changeover switch SW3) which receives a plurality of groups of input signals each indicating a set of a common mode voltage Va and a detection voltage Vb from a plurality of channels, switches to one of the plurality of groups and supplies the switched group to the offset voltage giving means, receives the set voltages 10s from the first DA converters 10 of the plurality of channels, switches to the set voltage 10s of a channel corresponding to the selected common mode voltage Va or detection voltage Vb and supplies the switched voltage to the offset voltage giving means.

10th solution means will now be described. Here, FIGS. 4(a) and 3 show the solution means according to the present invention.

There is provided the semiconductor testing apparatus characterized in that, one embodiment of the offset voltage giving means (an offset voltage giving circuit 300) comprises a second DA converter 30, a second operational amplifier A6, a first resistance R1, a second resistance R2 and a third resistance R3, the second DA converter 30 generates an offset voltage (an offsetting voltage Vd) with a reverse polarity which shifts a common mode voltage Va or a detection voltage Vb which are a substantially known positive voltage or a negative voltage to a predetermined low voltage based on offset set data which is set from the outside, the second operational amplifier A6, the first resistance R1 and the second resistance R2 constitute a reversal amplifier having a predetermined amplification degree, the first resistance R1 is connected between an input end which receives the common mode voltage Va or the detection voltage Vb and a negative input end of the second operational amplifier A6, the second resistance R2 is connected between an output end of the second operational amplifier A6 and the negative input end of the second operational amplifier A6, and the third resistance R3 is connected between an output end of the second DA converter 30 and the negative input end of the second operational amplifier A6, a positive input end of the second operational amplifier A6 is connected with a circuit earth, shifts both the common mode voltage Va and the detection voltage Vb to be input thereto to low voltages under the same condition, and outputs the obtained voltages.

11th solution means will now be described. Here, FIGS. 4(b) and 3 show the solution means according to the present invention.

There is provided the semiconductor testing apparatus characterized in that, one embodiment of the offset voltage giving means (an offset voltage giving circuit 300) comprises a second DA converter 30, a second operational amplifier A6, a first resistance R1, a second resistance R2, a third resistance R3 and a fourth resistance R4, the second DA converter generates an offset voltage (an offsetting voltage Vd) with the same polarity which shifts a common mode voltage Va or a detection voltage Vb which is a substantially know positive voltage or negative voltage to a predetermined low voltage based on offset setting data which is set from the outside, the second operational amplifier A6, the first resistance R1 and the second resistance R2 constitute a reversal amplifier having a predetermined amplification degree, the first resistance R1 is connected between an input end which receives the common mode voltage Va or the detection voltage Vb and a negative input end of the second operational amplifier A6, the second resistance R2 is connected between an output end of the second operational amplifier A6 and the negative input end of the second operational amplifier A6, the third resistance R3 is connected between an output end of the second DA converter 30 and a positive input end of the second operational amplifier A6, and the fourth resistance R4 is connected between the positive input end of the second operational amplifier A6 and a circuit earth, shifts both the common mode voltage Va and the detection voltage Vb which are input thereto to low voltages under the same condition, and outputs the obtained voltages.

12th solution means will now be described. Here, FIGS. 6(a) and 5 show the solution means according to the present invention.

There is provided the semiconductor testing apparatus characterized in that, one embodiment of the offset voltage giving means (an offset voltage giving circuit 300c) comprises a voltage reversing circuit 70, a second operational amplifier A6, a first resistance R1, a second resistance R2 and a third resistance R3, the voltage reversing circuit 70 receives a reference voltage (a set voltage 10s) generated from a first DA converter 10 included in the applied voltage source, and generates a predetermined offset voltage (a reversal voltage 70c) with a reversal polarity which shifts a common mode voltage Va or a detection voltage Vb, which is subjected to reversal amplification with a predetermined amplification degree, to a predetermined low voltage, the second operational amplifier A6, the first resistance R1 and the second resistance R2 constitute a reversal amplifier having a predetermined amplification degree, the first resistance R1 is connected between an input end which receives the common mode voltage Va or the detection voltage Vb and a negative input end of the second operational amplifier A6, the second resistance R2 is connected between an output end of the second operational amplifier A6 and the negative input end of the second operational amplifier A6, the third resistance R3 is connected between an output end of the voltage reversing circuit 70 and the negative input end of the second operational amplifier A6, and a positive input end of the second operational amplifier A6 is connected with a circuit earth, shifts both the common mode voltage Va and the detection voltage Vb input thereto to low voltages under the same condition, and outputs the obtained voltages.

13th solution means will now be described. Here, FIGS. 6(b) and 5 show the solution means according to the present invention.

There is provided the semiconductor testing apparatus is characterized in that, one embodiment of the offset voltage giving means (an offset voltage giving circuit 300d) comprises a second operational amplifier A6, a first resistance R1, a second resistance R2, a third resistance R3 and a fourth resistance R4, the second operational amplifier A6, the first resistance R1 and the second resistance R2 constitute a reversal amplifier having a predetermined amplification degree, the first resistance R1 is connected between an input end which receives a common mode voltage Va or a detection voltage Vb and a negative input end of the second operational amplifier A6, the second resistance R2 is connected between an output end of the second operational amplifier A6 and the negative input end of the second operational amplifier A6, the third resistance R3 is connected between an output end of a reference voltage (a set voltage 10s) generated from a first DA converter 10 included in the applied voltage source and a positive input end of the second operational amplifier A6, and the fourth resistance R4 is connected between the positive input end of the second operational amplifier A6 and a circuit earth, shifts both the common mode voltage Va and the detection voltage Vb input thereto to low voltages under the same condition, and outputs the obtained voltages.

14th solution means will now be described. Here, FIGS. 8(a) and 7 show the solution means according to the present invention.

There is provided the semiconductor testing apparatus characterized in that, one embodiment of the offset voltage giving means (an offset voltage giving circuit 300e) comprises a second operational amplifier A6, a first resistance R1, a second resistance R2 and a third resistance R3, the second operational amplifier A6, the first resistance R1 and the second resistance R2 constitute a reversal amplifier having a predetermined amplification degree, the first resistance R1 is connected between an input end which receives a common mode voltage Va or a detection voltage Vb and a negative input end of the second operational amplifier A6, the second resistance R2 is connected between an output end of the second operational amplifier A6 and the negative input end of the second operational amplifier A6, the third resistance R3 is connected between an output end of a reference voltage (a set voltage 10s) generated from a first DA converter 10 included in the applied voltage source and the negative input end of the second operational amplifier A6, and a positive input end of the second operational amplifier A6 is connected with a circuit earth, shifts both the common mode voltage Va and the detection voltage Vb input thereto to low voltages under the same condition, and outputs the obtained voltages.

15th solution means will now be described. Here, FIGS. 8(b) and 7 show the solution means according to the present invention.

There is provided the semiconductor testing apparatus characterized in that, one embodiment of the offset voltage giving means (an offset voltage giving circuit 300f) comprises a voltage reversing circuit 70, a second operational amplifier A6, a first resistance R1, a second resistance R2, a third resistance R3 and a fourth resistance R4, the voltage reversing circuit 70 receives a reference voltage (a set voltage 10s) generated from a first DA converter included in the applied voltage source, and generates a predetermined offset voltage (a reversal voltage 70c) with a polarity reversed from that of a common mode voltage Va or a detection voltage Vb which is subjected to reversal amplification with a predetermined amplification degree, the second operational amplifier A6, the first resistance R1 and the second resistance R2 constitute a reversal amplifier having a predetermined amplification degree, the first resistance R1 is connected between an input end which receives the common mode voltage Va or the detection voltage Vb and a negative input end of the second operational amplifier A6, the second resistance R2 is connected between an output end of the second operational amplifier A6 and the negative input end of the second operational amplifier A6, the third resistance R3 is connected between an output end of the voltage reversing circuit 70 and a positive input end of the second operational amplifier A6, and the fourth resistance R4 is connected between the positive input end of the second operational amplifier A6 and a circuit earth, shifts both the common mode voltage Va and the detection voltage Vb input thereto to low voltages under the same condition, and outputs the obtained voltages.

16th solution means will now be described. Here, FIG. 1(c) shows the solution means according to the present invention.

There is provided the semiconductor testing apparatus characterized in that one embodiment of the current/voltage converting means (e.g., current detection resisting means RM) includes a current measurement range function which comprises a signal resistance only or can switch to a predetermined resistance value by using a plurality of resistances and a switching relay.

17th solution means will now be described. Here, FIG. 10 shows the solution means according to the present invention.

There is provided the semiconductor testing apparatus characterized by further comprising:

means for performing measurement by applying gradual voltages to both ends of each of at least the first resistance and the second resistance included in the offset voltage giving means (e.g., offset voltage giving circuits 300, 300b, 300c, 300d, 300e and 300f) before a test of a DUT;

means for specifying a deviation of non-linear characteristic data of the obtained resistance from an ideal resistance; and means for performing linear correction with respect to a common mode voltage Va and a detection voltage Vb (or a potential difference Vx which is a difference value) obtained by measuring a current of the DUT based on non-linear characteristics of the specified resistance so that the non-linear characteristics of the resistance becomes the ideal resistance, thereby correcting error factors involved by peculiar non-linear characteristics of the resistance elements formed in a monolithic IC consisting of polysilicon or the like.

It is to be noted that the present invention may have any other practicable constituting means by appropriately combining the respective element means in the solution means. Additionally, although reference numerals given to the respective elements correspond to reference numerals shown in embodiments according to the present invention, the present invention is not restricted thereto, and it may have constituting means to which any other practicable equivalents are applied.

BEST MODE FOR CARRYING OUT THE INVENTION

Figure 1A:
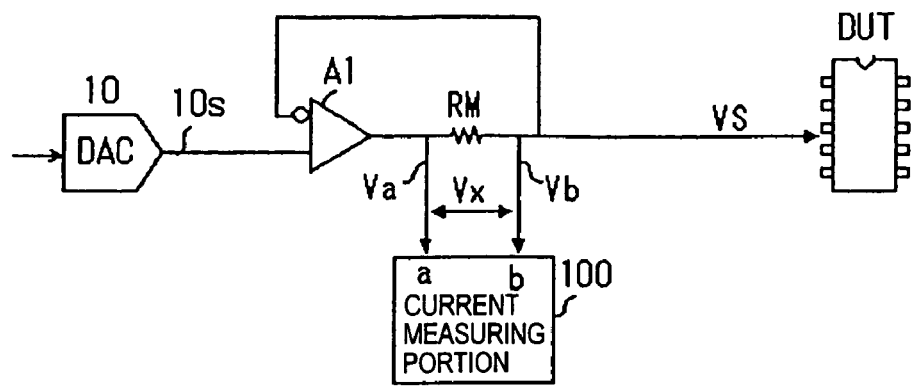
FIG. 1 shows a primary circuit configuration of one channel illustrating a conventional voltage source and current measurement (VSIM) which applies a desired voltage to a DUT and measures a current at this moment, its internal fundamental circuit diagram, and an example of current detection resisting means RM including a measurement range function.
Figure 1B:
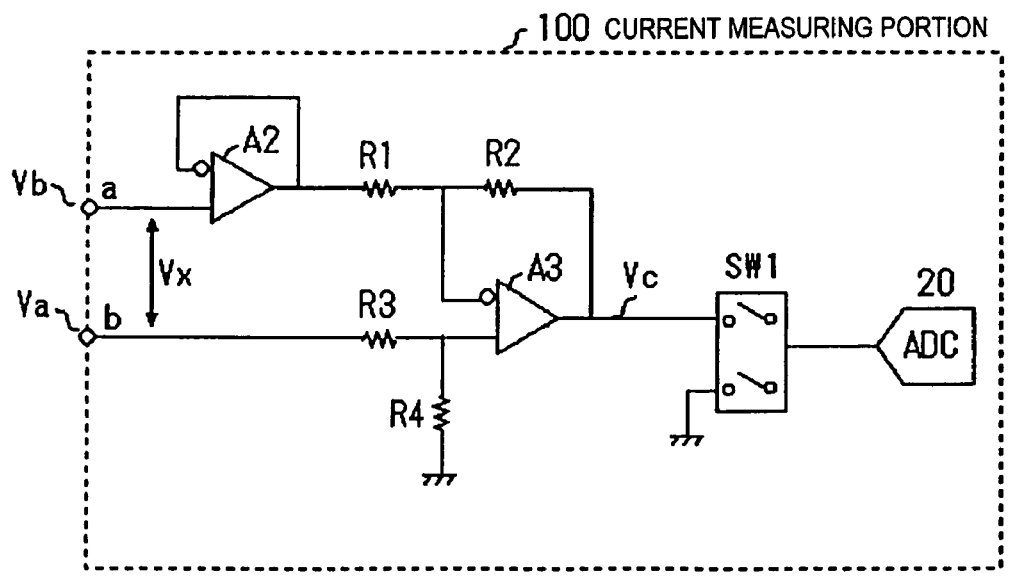
Figure 1C:
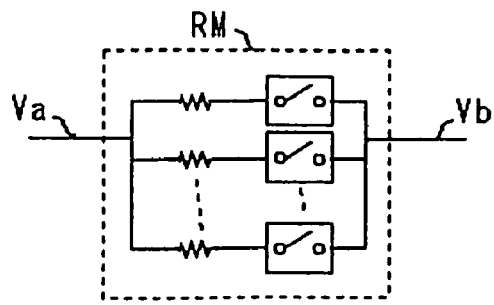

An embodiment to which the present invention is applied will now be described hereinafter with reference to the accompanying drawings. Further, claims are not restricted by an explanation content of the following embodiment, and elements, connection relationships and others described in the embodiment are not necessarily required for the solution means. Furthermore, descriptions/conformations of elements, connection relationships and others written in the embodiments are an example, and the present invention is not restricted to contents of the descriptions/conformations.

The present invention will now be described hereinafter with reference to FIGS. 3 to 9. It is to be noted that like reference numerals denote elements corresponding to conventional structures, and the explanation of tautological parts will be eliminated.

Figure 2A:
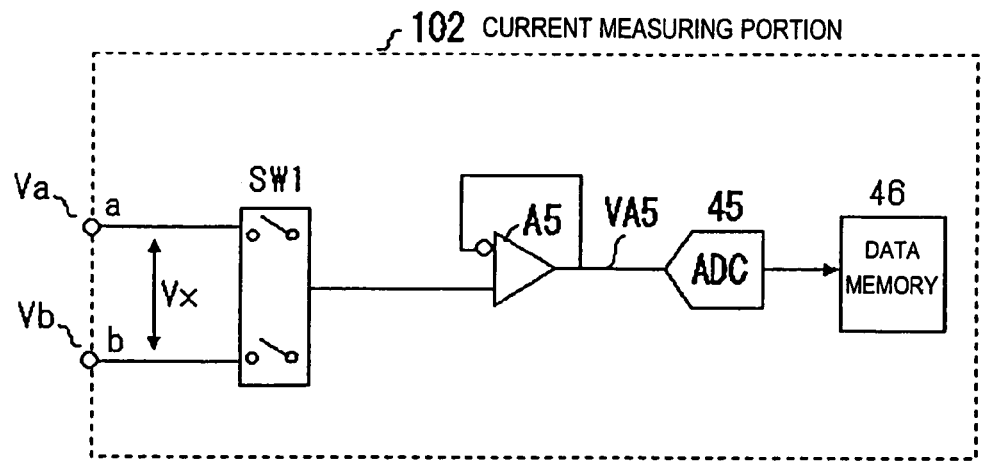
FIG. 2 shows a primary fundamental structural example when measuring a current of an IC pin of one channel and a primary fundamental structure of a current measuring portion which measures a current of an IC pin of a DUT in each of a plurality of channels in a prior art.
Figure 2B:
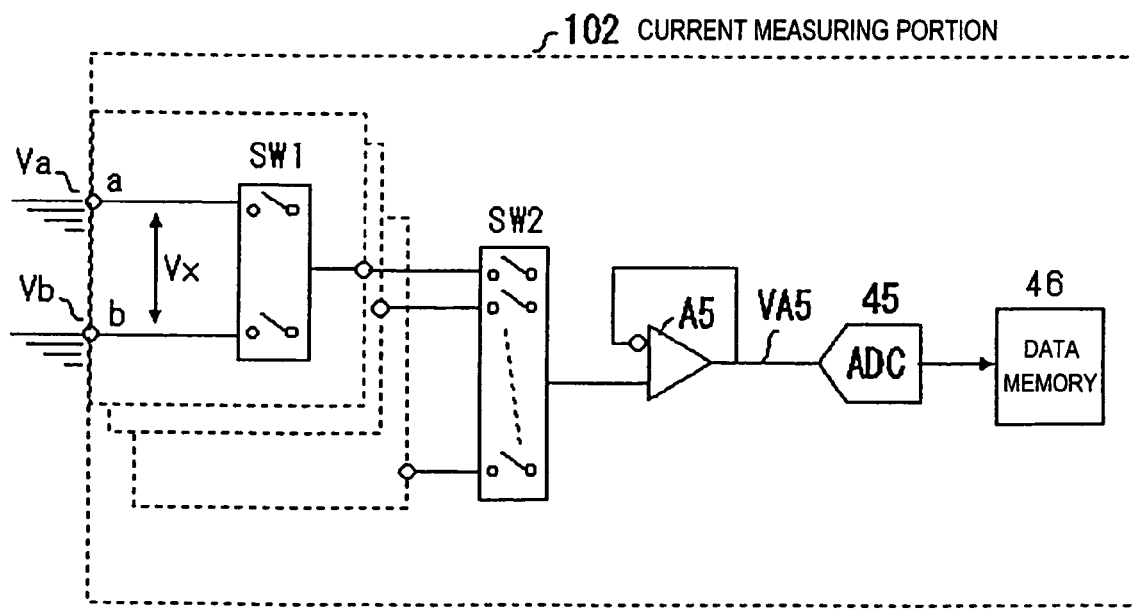
Figure 3A:
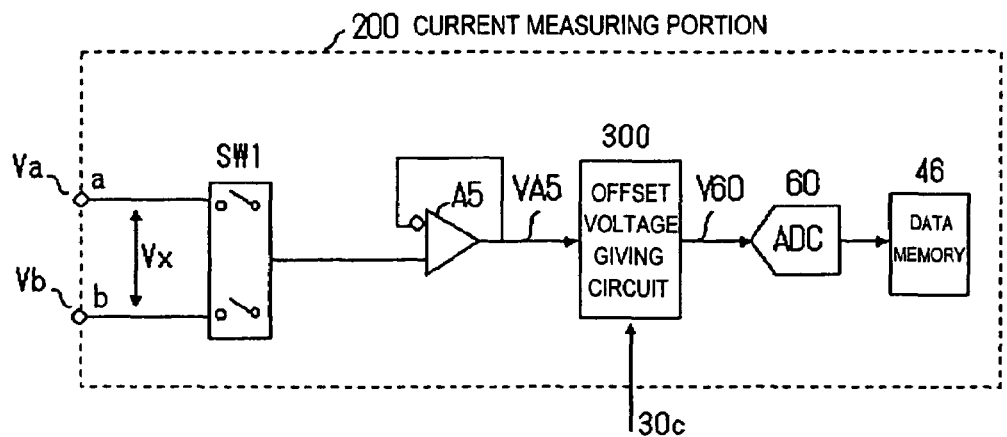
FIG. 3 shows a primary structural example of a current measuring portion which measures a current of an IC pin of a DUT in each of a plurality of channels according to the present invention, and illustrates an example of accepting one channel and an example of accepting a plurality of channels.
Figure 3B:
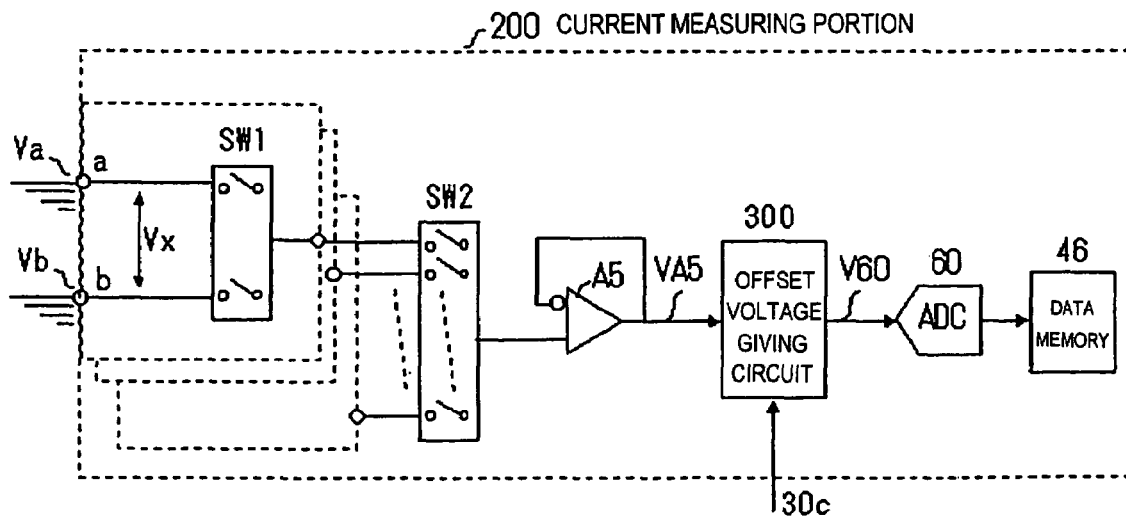

FIG. 3 shows a primary structural example of a current measuring portion which measures a current of an IC pin of a DUT having a plurality of channels according to the present invention, and corresponds to examples in which one channel is accepted and a plurality of channels are accepted. This structure is a structure in which an offset voltage giving circuit 300 is added to a structural example depicted in FIG. 2.

The offset voltage giving circuit 300 is inserted between an operational amplifier A5 and an AD converter 60, receives a common mode voltage Va and a detection voltage Vb at both ends of current detection resisting means RM through a changeover switch SW1 and a changeover switch SW2, receives a high-voltage signal VA5 indicative of a high voltage resulting from buffering in the operational amplifier A5, and shifts down each voltage to a differential output voltage V60 which is a low voltage. For example, the AD converter 60 shifts down the common mode voltage Va and the detection voltage Vb which are in the vicinity of 30 V to the low differential output voltage V60 which falls within a voltage range with which quantization conversion is possible, e.g., less than ±1 V.

Figure 4A:
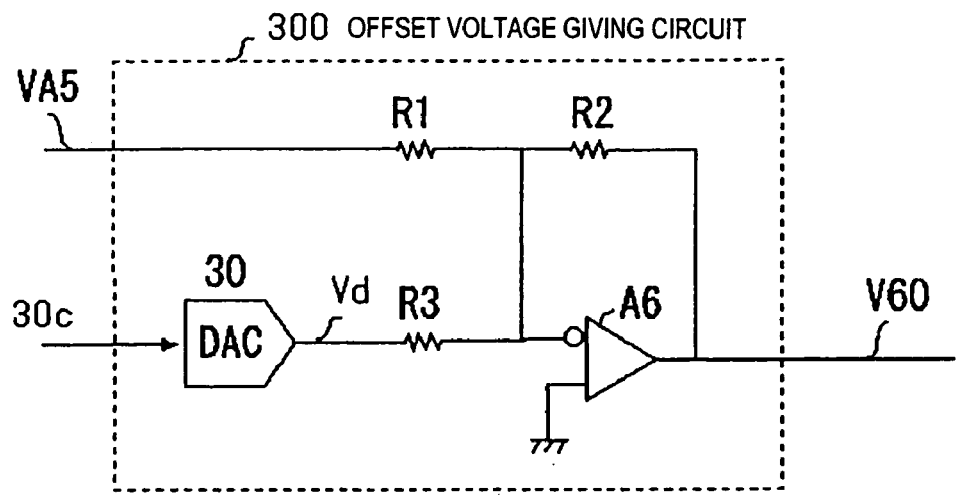
FIG. 4 shows a first internal structural example and a second internal structural example of an offset voltage giving circuit.

FIG. 4(a) shows a first internal structural example of the offset voltage giving circuit.

As constituent elements of this circuit, there are included, e.g., a DA converter 30, resistances R1, R2 and R3, and an operational amplifier A6.

When the resistance R3 is excluded, a circuit configuration formed of the resistances R1 and R2 and the operational amplifier A6 is a general reversal amplification structure, and the high-voltage signal VA5 is supplied to a negative input end through the resistance R1. This negative input end performs a feedback operation which constantly maintains a state of 0 V which is the same as that on a positive input end side by an operational amplification effect of the operational amplifier. An output end of the operational amplifier A6 outputs a differential output voltage V60 resulting from reversal amplification with an amplification factor n determined by the resistances R1 and R2.

The resistance R3 and the DA converter 30 are offset giving means which is used to shift down the output differential output voltage V60 to a desired voltage close to 0 V, and this means is connected to the negative input end of the operational amplifier A6 through the resistance R3. As a result, an offset voltage Vd in an opposite direction can be supplied to the negative input end of the operational amplifier A6 through the resistance R3 so that the input high-voltage signal VA5 is offset. In this example, the DA converter 30 can generate a desired voltage which is a positive voltage/negative voltage based on set data 30c.

Incidentally, as to a setting control over the DA converter 30 for current measurement, the cooperative setting control must be carried out so that shifting down to a desired voltage can be effected in cooperation with a change in settings on the DA converter 10 side for voltage application to a DUT.

As a result, by performing in a desired manner the setting control over the set data 30c which is supplied to the DA converter 30, the differential output voltage V60 of the operational amplifier A6 can be shifted down to the low differential output voltage V60 close to 0 V irrespective of the input high-voltage signal VA5. Consequently, there can be obtained a great advantage that an inexpensive AD converter with a low resolution can be used.

Figure 9:
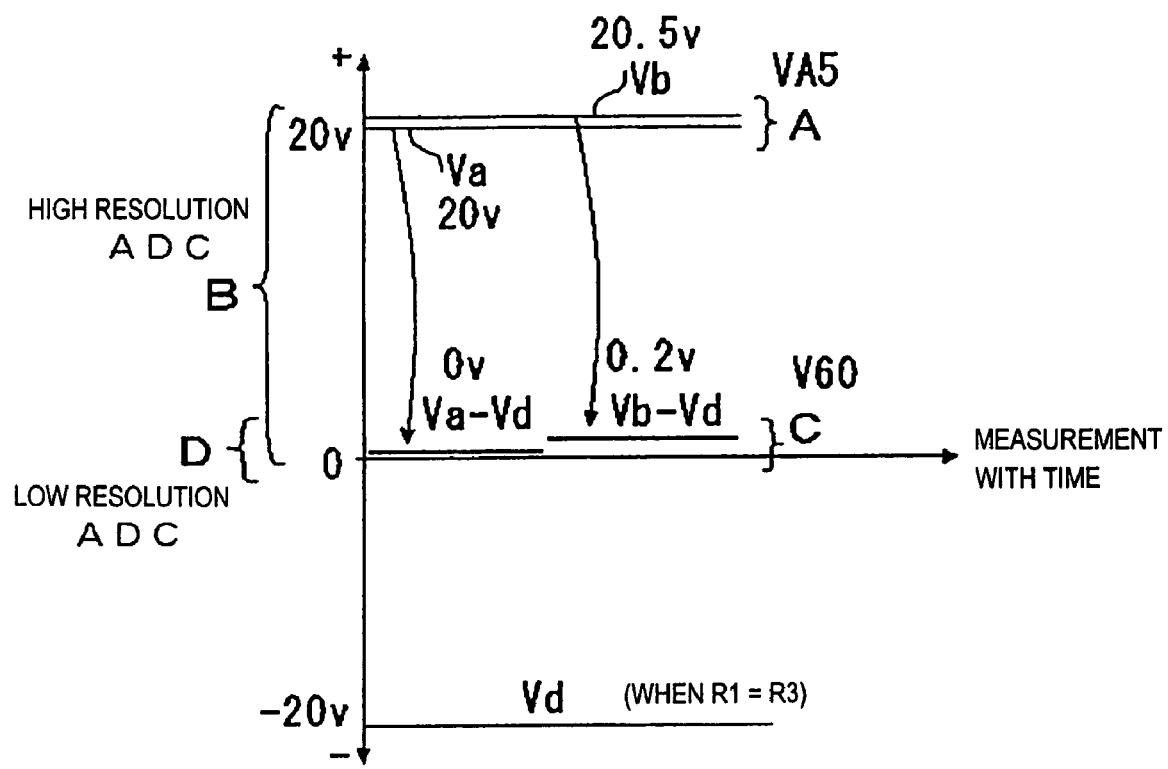
FIG. 9 is a view illustrating an shift down operation for a voltage by an offset voltage giving means 300.

FIG. 9 is a view illustrating a voltage shift down operation by the offset voltage giving circuit 300. Here, the common mode voltage Va is 20 V and the detection voltage Vb is 20.2 V in FIG. 3(a), a potential difference Vx at this moment is 0.2 V. Furthermore, it is assumed that a resolution for quantization in the AD converter is based on a unit of 0.1 mV.

In case of the condition of the above-described numeral values, the conventional measurement structure shown in FIG. 2 is a structure which directly subjects the common mode voltage Va and the detection voltage Vb which are high voltages to quantization conversion by the AD converter, and hence an AD converter with a high resolution which can subject up to 20.2 V to quantization conversion is required. As a result, an AD converter with a 18-bit resolution which can be increased to a resolution of up to 202000 must be applied in order to perform measurement.

On the other hand, in the present invention, since performing quantization conversion with respect to 0 V or 0.2 V of the low differential output voltage V60 shifted down to a voltage close to 0 V can suffice, an AD converter with a low resolution which can subject up to 0.2 V to quantization conversion. Consequently, there can be obtained a great advantage that an inexpensive AD converter with a 11-bit resolution which can be increased to a resolution of up to 2000.

According to a circuit configuration of the offset voltage giving circuit 300 of the present invention shown in FIG. 4(a), an impact on a measurement accuracy involved by irregularities in constituent components can be minimized. This will be described below while taking numeral examples. Here, like the prior art, $\alpha$ is an error ratio with respect to a target resistance value, and n is a gain. Further, an offset=Ao is assumed as an error factor of the operational amplifier A5, and an offset=Bo is assumed as an error factor of the operational amplifier A6 in FIG. 3(a, b).

R1=R(1+$\alpha$), R2=n*R(1−$\alpha$) and R3=R(1−$\alpha$) can be regarded as error factors of the respective resistances.

A common mode voltage measurement value Va1 with respect to the common mode voltage Va can be represented by an expression Va1=−Va(R2/R1)+Vc(R2/R3)+Ao(R2/R1)+Bo(R2+(R1//R3))/(R1//R3)

A detection voltage measurement value Vb1 with respect to the detection voltage Vb can be represented by an expression Vb1=−Vb(R2/R1)+Vc(R2/R3)+Ao(R2/R1)+Bo(R2+(R11R3))/(R1//R3).

Here, Vb=Va−Vx is substituted. Furthermore, drifting error factors of the common mode voltage Va and the detection voltage Vb involved by, e.g., changes in temperature can be regarded as the same since the both signals are switched by the changeover switch SW1 and measured in a short period. Therefore the following expression can be obtained.

$$Va1-Vb1=(Vb-Va)(R2/R1)=Vx(R2/R1)$$

As a result, the error factors of the resistances R1 and R2 alone become gain errors with respect to Vx as a measurement value. Therefore, it can be revealed that other error factors are not affected.

In the circuit according to the present invention shown in FIG. 4(a), since the operational amplifier A6 is used as a reversal amplifier and its positive input terminal is connected with a circuit earth (0 V), a reversal input terminal is subjected to a feedback control to enter a state of 0 V.

When it is determined that Va≈Vc, the voltage applied to both ends of the resistance R2 is in proportion to a differential voltage of Va−Vb.

Moreover, a change in voltage applied to both ends of R1 when measuring the common mode voltage Va and the detection voltage Vb is in proportion to Vx, and it is not dependent on the common mode voltage Va.

Therefore, with the peculiar non-linear characteristics of the resistance elements, resistance values vary due to the applied voltage, but there can be obtained an advantage that the impact of the peculiar non-linear characteristics can be minimized to a change which is in proportion to Vx. Therefore, the accurate measurement of a current flowing through the DUT can be realized. As a result, with respect to formation of a monolithic IC to which polysilicon-based thin film resistances are used, there can be obtained a great advantage that the IC can be formed with the minimum impact of the measurement accuracy. This results in a circuit configuration which is superior in formation of the IC.

Figure 4B:
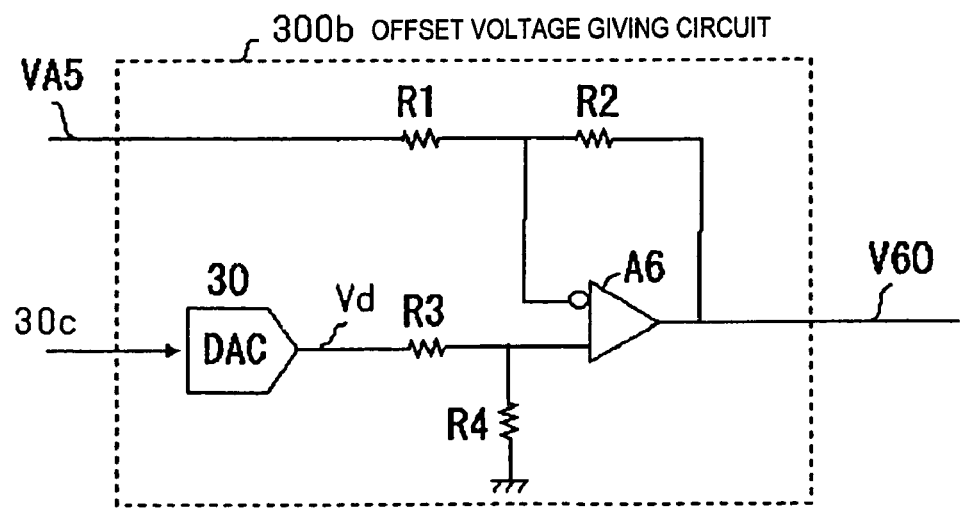

FIG. 4(b) shows a second internal structural example of an offset voltage giving circuit.

The second internal structure of this offset voltage giving circuit 300b is a structural example in which a resistance R4 is added to the constituent elements shown in FIG. 4(a) and the connection is changed.

The resistance R4 as well as a resistance R3 is a resistance for voltage division which divides an offset voltage Vd output from a DA converter 30 in a desired manner. One end of the resistance R4 is connected with a circuit earth, and the other end of the same is connected with a positive input end of an operational amplifier A6 and one end of the resistance R3. The other end of the resistance R3 is connected with an output end of the DA converter 30. This example is suitable for a case where a test voltage VS applied to a DUT is low.

In measurement, although a measurement error involved by irregularities in resistance values of the resistances R3 and R4 is generated in a differential output voltage V60 of the operational amplifier A6, a common mode voltage measurement value Va1 obtained by measuring a common mode voltage Va at one of both ends of current detection resisting means RM and a detection voltage measurement value Vb1 obtained by measuring a detection voltage at the other end are respectively measured in a short time. Thereafter, as a result of subtraction processing of Va1−Vb1 in software operation processing, error factors of the differential output voltage V60, the resistance R3 and the resistance R4 used under the same measurement condition in a short time have an advantage that no error is substantially generated due to offsetting of an error quantity by the subtraction processing.

Therefore, according to the structural example of the present invention shown in FIG. 4(b), there is provided an advantage that the impact of voltage coefficient characteristics of the resistances R1 and R2 can be minimized to a change which is in proportion to Vx. Accordingly, the accurate measurement of a current flowing through the DUT can be realized.

Figure 5A:
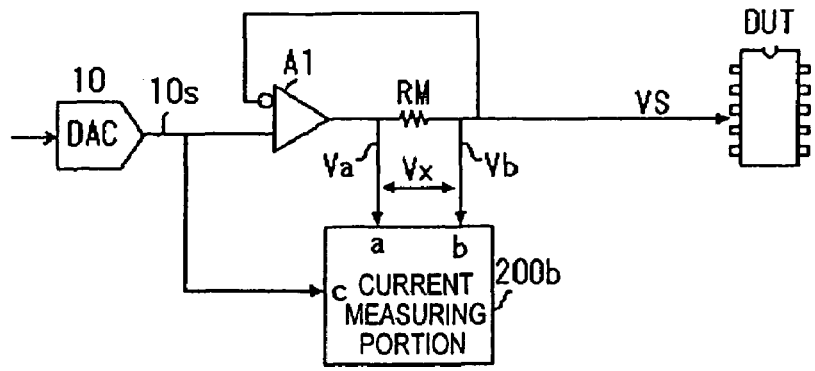
FIG. 5 shows another primary circuit structural example illustrating a voltage source and current measurement (VSIM) which applies a voltage to a DUT and measures a current of one channel at this moment according to the present invention, an internal fundamental circuit diagram of a current measuring portion 200b which receives a common mode voltage Va, a detection voltage Vb and a set voltage 10s of one channel and measures a current, an internal fundamental circuit diagram of the current measuring portion 200b which measures a current upon receiving the common mode voltage Va, the detection voltage Vb and the set voltage 10s from a plurality of channels, and an internal structural example of a voltage reversing circuit 70.

FIG. 5(a) shows another primary circuit configuration example, illustrating a voltage source and current measurement (VSIM) which applies a voltage to a DUT and measures a current of one channel at this moment according to the present invention. As primary constituent elements, there are provided a DA converter 10, an operational amplifier A1, a current detection resisting means RM and a current measuring portion 200b.

The DA converter 10 generates a set voltage 10s which should be applied to an IC pin of a DUT, supplies this voltage to a positive input end of the operational amplifier A1, and also supplies the voltage to the current measuring portion 200b.

The current measuring portion 200b according to the present invention has an internal structure that the DA converter 30 in the internal structure of the offset voltage giving circuit 300 shown in FIG. 4(a, b) is eliminated and the set voltage 10s which is applied to the DUT is received from the DA converter 10 instead.

Figure 5B:
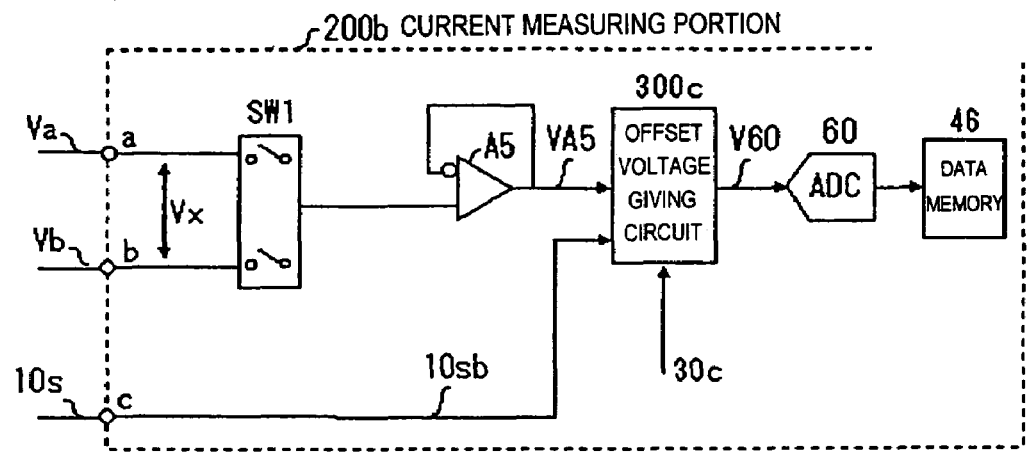
Figure 5C:
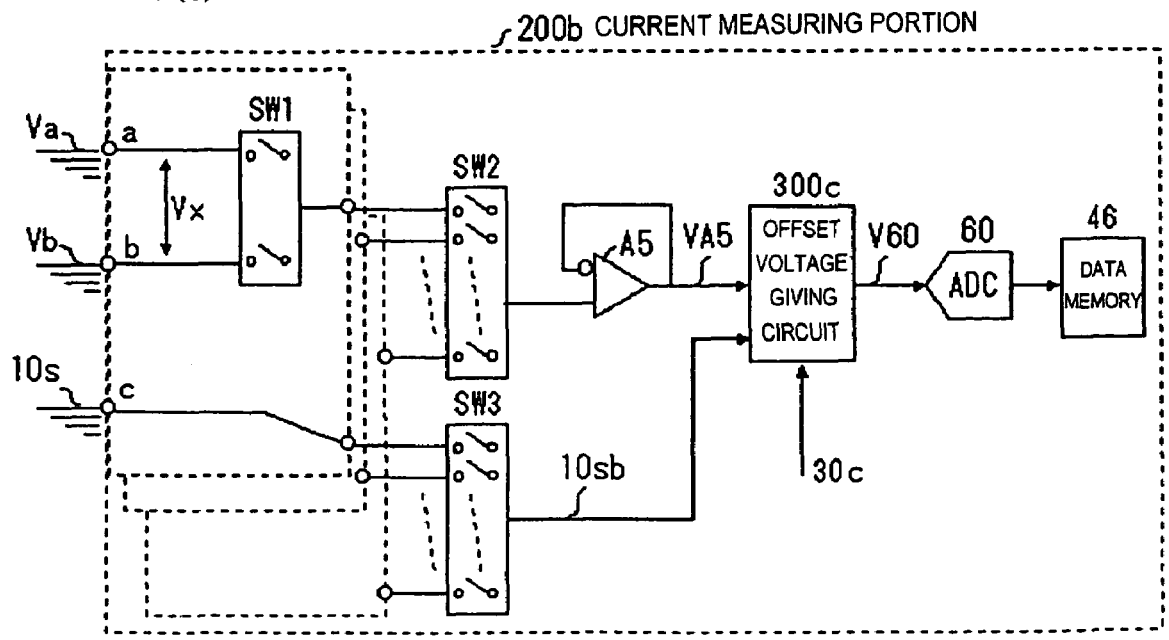

FIG. 5(b) is an internal fundamental circuit diagram of the current measuring portion 200b which receives a common mode voltage Va, a detection voltage Vb and the set voltage 10s of one channel corresponding to FIG. 5(a) and measures the current. FIG. 5(c) is an internal fundamental circuit diagram of the current measuring portion 200b when receiving the common mode voltage Va, the detection voltage Vb and the set voltage 10s from a plurality of channels and measures the current.

An offset voltage giving circuit 300c in FIGS. 5(b) and (c) receives the set voltage 10s from the DA converter 10, receives the above-described high-voltage signal VA5 and outputs a differential output voltage V60 which is a low voltage obtained by shifting down the voltage to a voltage close to 0 V.

Figure 6A:
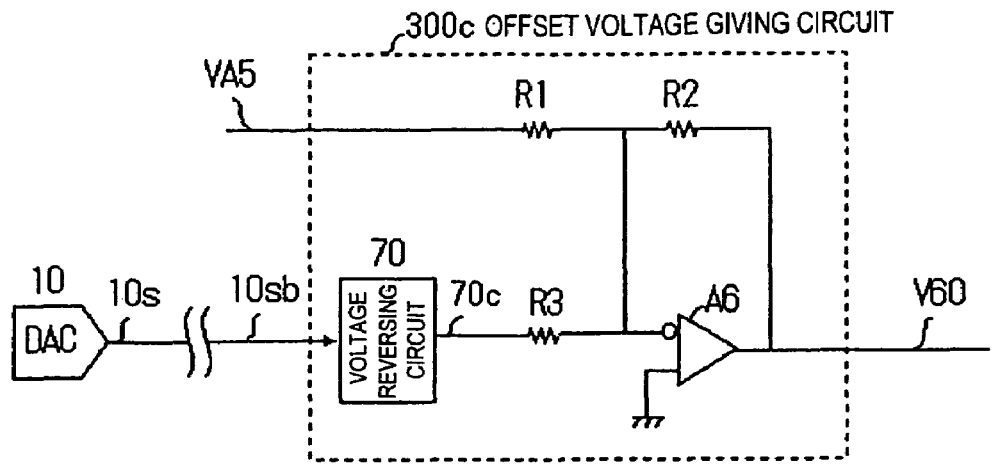
FIG. 6 shows a first internal structural example and a second internal structural example of an offset voltage giving circuit 300c.
Figure 6B:
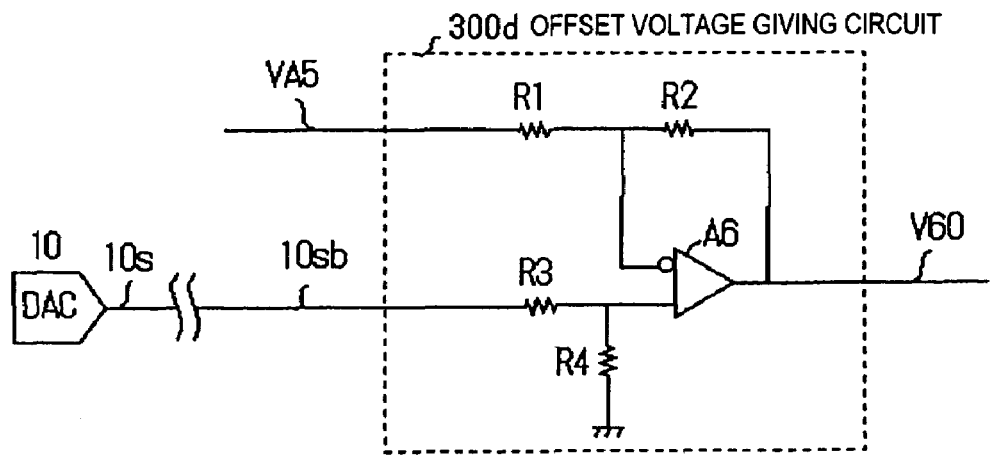

FIG. 6(a) shows a first internal structural example of the offset voltage giving circuit 300c, and FIG. 6(b) shows a second internal structural example of the offset voltage giving circuit 300d.

FIG. 6(a) shows an example in which a voltage reversing circuit 70, resistances R1, R2 and R3 and an operational amplifier A6 are provided as constituent elements, and FIG. 6(b) shows an example in which resistances R1, R2, R3 and R4 and an operational amplifier A6 are provided as constituent elements.

Figure 6C:
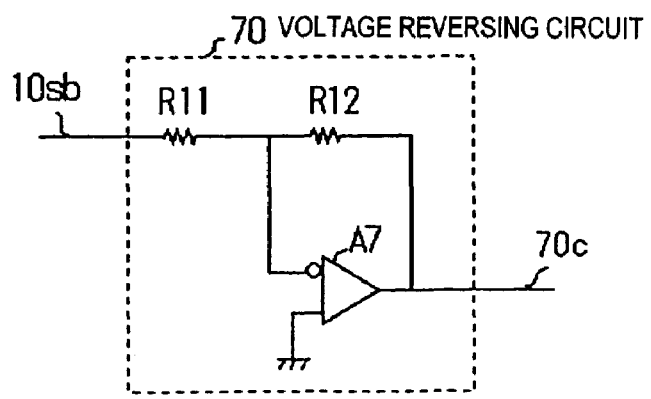

As shown in FIG. 6(c), the voltage reversing circuit 70 receives the set voltage 10s input thereto, and outputs a reversal voltage 70c obtained by subjecting a polarity of this input voltage to reversal amplification by an operational amplifier A7. As an example, when the input voltage is +10 V, −10 V is output. However, since the reversal voltage 70c is offset by an arithmetic operation of Va1−Vb1 by the above-described software operation processing, the highly accurate reversal amplification is not required. Therefore, resistances R11 and R12 do no have to have exactly the same resistance value. Even if the operational amplifier A7 has offset irregularities, the offset irregularities cannot be an obstacle. It is to be noted that the other resistances R1, R2 and R3 and the operational amplifier A6 are the same as those in FIG. 4, their explanation will be eliminated.

In this structure, even if the setting of the DA converter 10 for applying a voltage to the DUT is changed for a desired voltage, there can be obtained an advantage that the voltage is always offset to a state of substantially 0 V in case of a no-load-current. Further, a setting control can be facilitated.

Therefore, according to the structural examples of the present invention shown in FIGS. 5 and 6, since sharing the DA converter 10 can eliminate the DA converter 30 mentioned above, there can be obtained an advantage that the structure can be further inexpensively realized. Further, since the set voltage for current measurement can be also changed in cooperation with a setting change on the DUT voltage application DA converter 10 side, the setting control with the excellent convenience is possible.

Figure 7A:
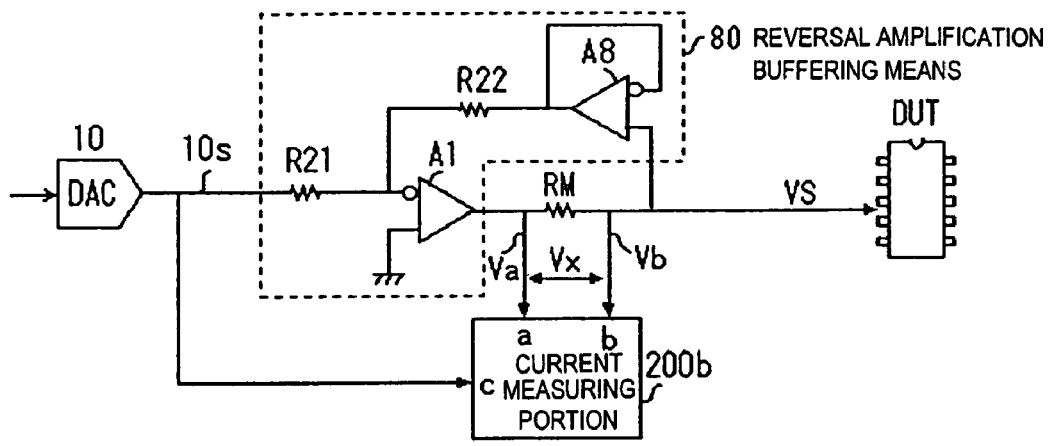
FIG. 7 shows still another primary circuit structural example illustrating a voltage source and current measurement (VSIM) which applies a voltage to a DUT and measures a current of one channel at this moment according to the present invention, and internal structural examples of a current measuring portion 200b when measuring a current of one channel and when measuring currents of a plurality of channels.

FIG. 7(a) shows still another primary circuit configuration example, illustrating a voltage source and current measurement (VSIM) which applies a voltage to a DUT and measures a current of one channel at this moment according to the present invention. There are provided a DA converter 10, reversal amplification buffering means 80, current detection resisting means RM and a current measuring portion 200b as primary constituent elements.

The DA converter 10 generates a set voltage 10s subjected to voltage reversal with respect to a test voltage VS which should be applied to an IC pin of a DUT. This voltage is also supplied to the current measuring portion 200b.

An operational amplifier A1 is an operational amplifier for error reduction and power increase which receives the set voltage 10s and supplies this voltage as the test voltage VS to the IC pin of the DUT through the current detection resisting means RM.

The reversal amplification buffering means 80 comprises resistances R21 and R22 and operational amplifiers A1 and A8. This receives the set voltage 10s from the DA converter 10, outputs the test voltage VS subjected to voltage amplification and polarity reversal, and supplies this voltage to the DUT.

The operational amplifier A1 has a reversal amplification structure, and an amplification factor for reversal amplification is determined by resistances R21 and R22. The operational amplifier A8 receives the test voltage VS with a high impedance, subjects this voltage to voltage buffering, and then supplies this voltage to the resistance R22. As a result, when R21=R22 and an input voltage is +10 V, for example, the test voltage VS of −10 V is supplied to the DUT.

Figure 7B:
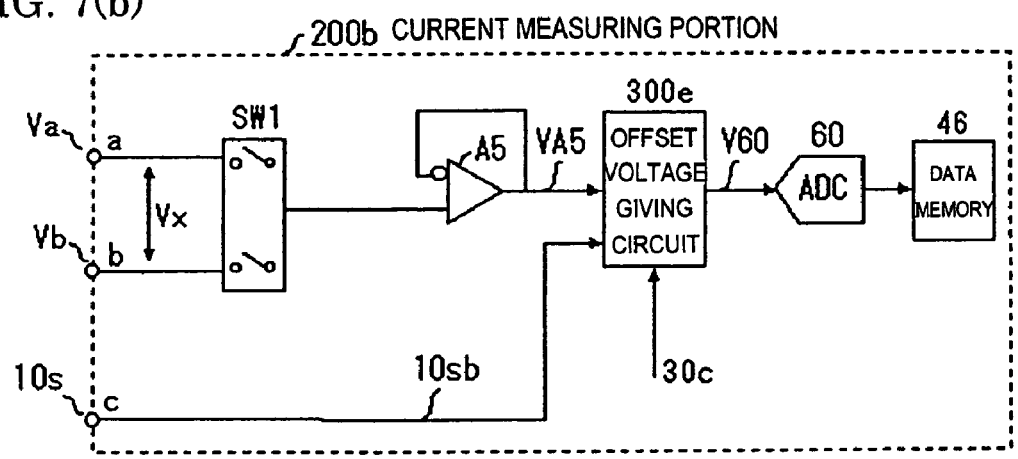
Figure 7C:
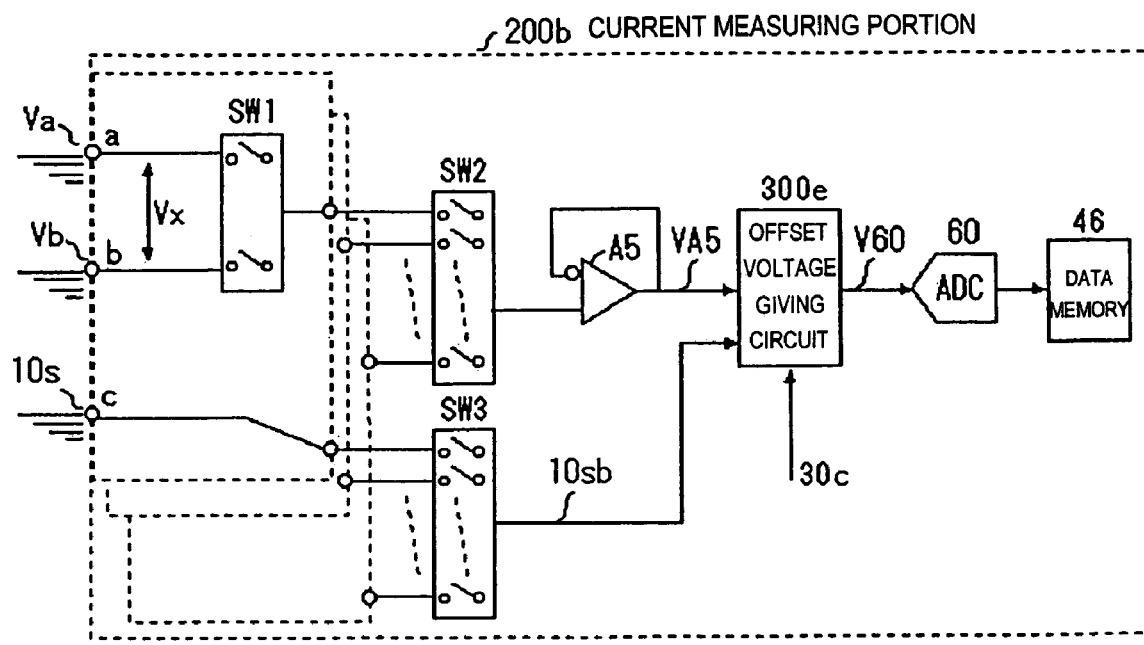

The offset voltage giving circuit 300e according to the present invention shown in FIGS. 7(b) and 7(c) is inserted between an operational amplifier A5 and an AD converter 60, receives a common mode voltage Va and a detection voltage Vb at both ends of the current detection resisting means RM via a changeover switch SW1 through a high-voltage signal VA5 buffered in the operational amplifier A5, and shift downs the voltages to a differential output voltage V60 which is a low voltage.

FIG. 8 is an internal fundamental circuit diagram showing the offset voltage giving circuit 300e.

Figure 8A:
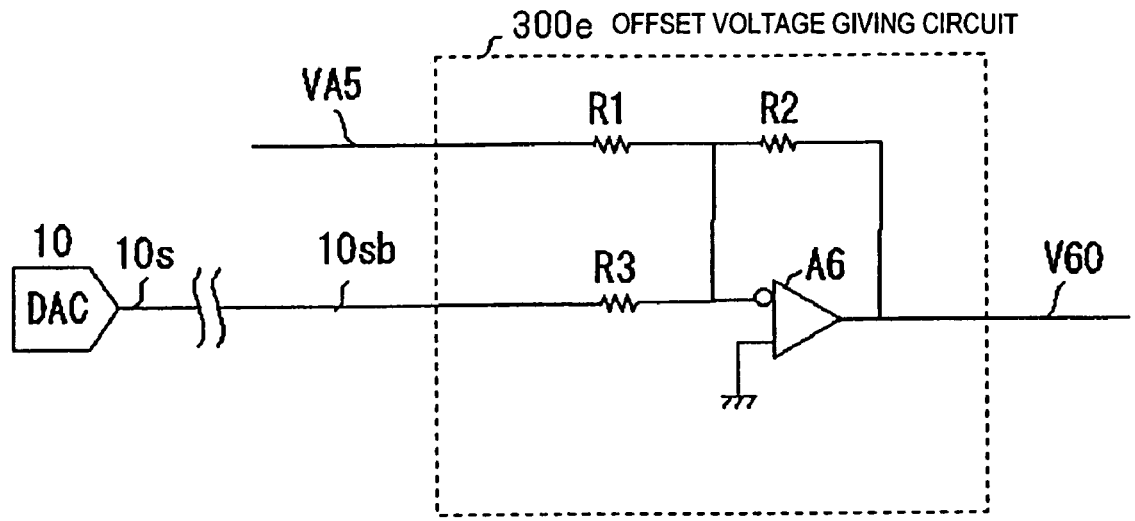
FIG. 8 is an internal fundamental circuit diagram of an offset voltage giving means 300e.
Figure 8B:
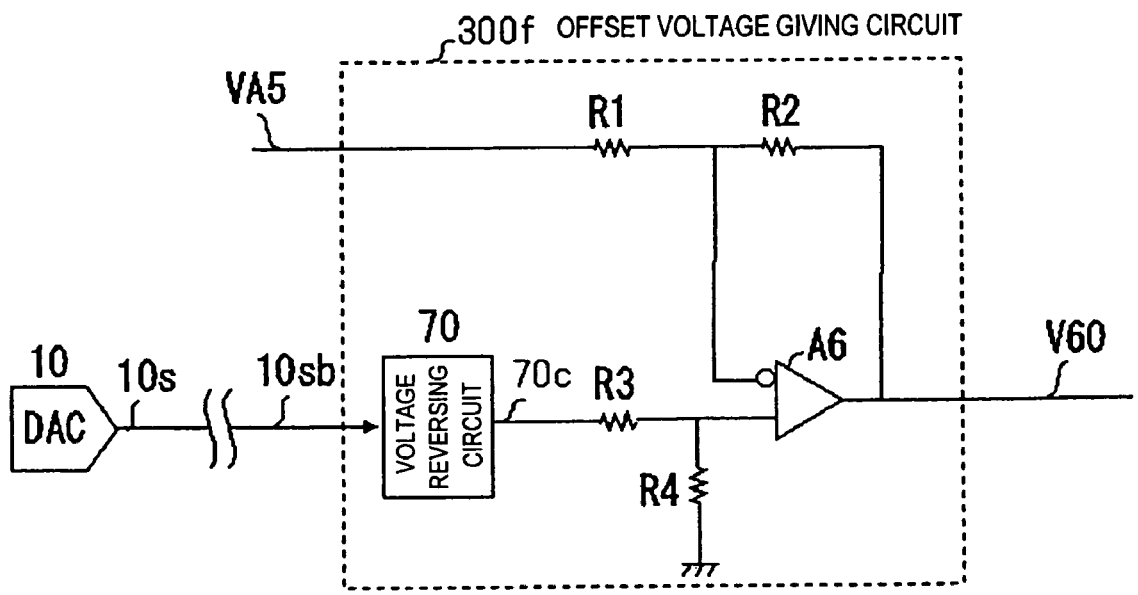

FIG. 8(a) shows an example in which the offset voltage giving circuit 300e comprises resistances R1, R2 and R3 and an operational amplifier A6 as constituent elements, and FIG. 8(b) shows an example in which the offset voltage giving circuit 300f comprises a voltage reversing circuit 70, resistances R1, R2, R3 and R4 and an operational amplifier A6 as constituent elements. Their internal operations are substantially the same as those in FIG. 4, and hence their explanation will be eliminated. As a result, the DA converter 10 shown in FIG. 7(a) can be shared and used.

Therefore, according to the structural examples of the present invention shown in FIGS. 7 and 8, since the above-described DA converter 30 can be eliminated by sharing the DA converter 10, there can be obtained an advantage that the structure can be further inexpensively realized. Moreover, since the set voltage for current measurement can be also changed in cooperation with the setting change on the DUT voltage application DA converter 10 side, the setting control with the excellent convenience is possible. Of course, like FIG. 4(a), there can be obtained an advantage that the impact of the voltage coefficient characteristics of the resistances R1 and R2 can be suppressed to the minimum level of a change which is in proportion to Vx. Therefore, the accurate measurement of a current flowing through the DUT can be realized.

It is to be noted that the technical concept of the present invention is not restricted to the concrete structural examples and the connection embodiment examples of the foregoing embodiments. Additionally, the foregoing embodiments may be appropriately modified and widely applied based on the technical concept of the present invention.

For example, although the structural examples shown in FIGS. 5(c) and 7(c) are structural examples in which the changeover switch SW3 receives the set voltages 10s from a plurality of channels, switches the voltage to one of the received voltages and outputs the switched voltage, the structure in which the changeover switch SW3 is directly connected with the DA converter 10 of a specific channel is also practicable, and hence the structure in which the changeover switch SW3 is deleted may be adopted if desired.

Figure 10:
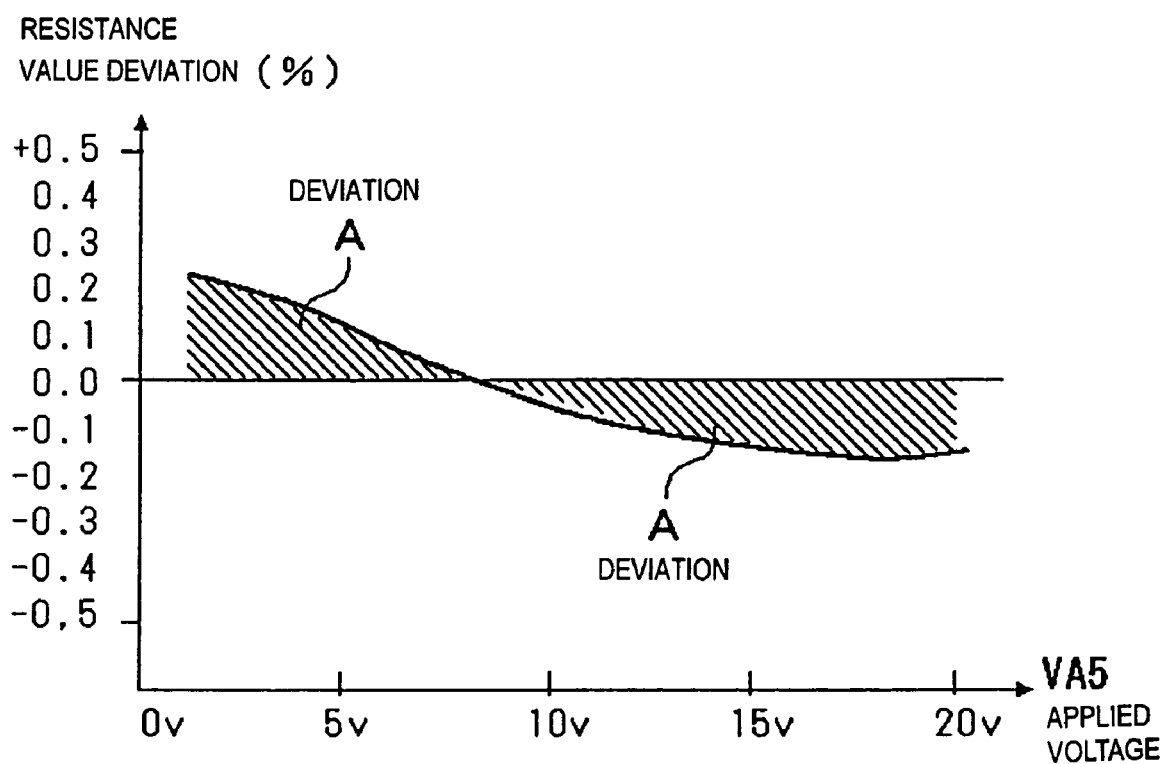
FIG. 10 is an explanatory view showing generation of a non-linear deviation from an ideal resistance by an applied voltage.

Further, means for performing a calibration correction with respect to the peculiar non-linear characteristics of the resistance elements shown in FIG. 10 may be additionally provided. That is, gradual voltages are applied to circuit parts as correction targets, e.g., the resistances R1 and R2 shown in FIG. 4, and a differential output voltage V60 for each applied voltage is measured. A deviation from an ideal resistance is previously obtained as a linear correction quantity from measurement data for each applied voltage mentioned above, and the obtained quantity is saved as a calibration correction quantity. By performing correction operation processing using software processing upon receiving the measurement data of the differential output voltage V60 based on the obtained correction quantity, the deviation involved by the non-linearity can be improved. As a result, the accuracy of the measurement of a current flowing through the DUT can be further improved.

INDUSTRIAL APPLICABILITY

The present invention demonstrates the following effects based on the above description content.

According to the circuit configuration shown in FIG. 4(a), the differential output voltage V60 of the operational amplifier A6 can be shifted down to the differential output voltage V60 close to 0 V irrespective of the input high-voltage signal VA5 by performing the setting control over the set data supplied to the DA converter in a desired manner. As a result, there can be obtained a great advantage that the inexpensive AD converter with a low resolution can be used.

According to the circuit configuration shown in FIG. 4(a), there can be obtained an advantage that the impact of the peculiar non-linear characteristics of the resistances R1 and R2 can be suppressed to the minimum level of a change which is in proportion to Vx. Therefore, the accurate measurement of a current flowing through the DUT can be realized. Consequently, with respect to formation of a monolithic IC to which polysilicon-based thin film resistances are applied, there can be obtained a great advantage that the IC can be formed with the minimum impact of the measurement accuracy. This results in a circuit configuration suitable for formation of the IC.

According to the structural example of the present invention shown in FIG. 4(b), like FIG. 4(a), there can be obtained an advantage that the impact of the voltage coefficient characteristics of the resistances R1 and R2 can be minimized to a change which is in proportion to Vx. Therefore, the accurate measurement of a current flowing through the DUT can be realized.

According to the structural example of the present invention shown in FIGS. 5 and 6, since the above-described DA converter 30 can be eliminated by sharing the DA converter 10, there can be obtained an advantage that the structure can be further inexpensively realized. Furthermore, since the set voltage for current measurement can be also changed in cooperation with the setting change on the DUT voltage application DA converter 10 side, the setting control with the excellent convenience is possible.

According to the structural example of the present invention shown in FIGS. 7 and 8, since the above-described DA converter 30 can be eliminated by sharing the DA converter 10, there can be obtained an advantage that the structure can be further inexpensively realized. Moreover, since the set voltage for current measurement can be also changed in cooperation with the setting change on the DUT voltage application DA converter 10 side, the setting control with the excellent convenience is possible. Of course, like FIG. 4(a), there is provided an advantage that the impact of the voltage coefficient characteristics of the resistances R1 and R2 can be minimized to a change which is in proportion to Vx. Therefore, the accurate measurement of a current flowing through the DUT can be realized.

Therefore, the technical effects of the present invention are large, and the industrial economic effect is also great.

The invention claimed is:

1. A semiconductor testing apparatus including a function which applies a predetermined direct current to an IC pin of a device under test (DUT) and measures a current flowing at this moment, comprising:
   an applied voltage source which applies a predetermined constant voltage to the DUT;
   current/voltage converting means for directly inserting a predetermined resistance between an output end of the applied voltage source and the IC pin of the DUT, and converting a quantity of the current flowing through the DUT into a voltage; and when a voltage at the output end of the applied voltage source is a common mode voltage, a voltage applied to the DUT through the current/voltage converting means is a detection voltage, and a difference between the both voltages is a potential difference, current measuring means for switching and receiving the common mode voltage and the detection voltage in time series, shifting each received voltage to a predetermined low voltage, and respectively outputting low-voltage measurement data obtained by receiving each shifted voltage and subjecting the received voltage to quantization conversion.

2. The semiconductor testing apparatus according to claim 1, wherein the applied voltage source comprises a first DA converter and a first operational amplifier, the first DA converter generates a predetermined reference voltage based on set data which is set from the outside, the first operational amplifier is an operational amplifier for a power, receives the reference voltage at a positive input end thereof, receives a test voltage which is supplied to the DUT at a negative input end thereof, and supplies the voltage as the test voltage to the DUT from an output end of the first operational amplifier through the current/voltage converting means, and the voltages are supplied as the common mode voltage and the detection voltage to first current measuring means from the both ends of the current/voltage converting means.

3. The semiconductor testing apparatus according to claim 2, wherein the applied voltage source further supplies the reference voltage generated by the first DA converter to second current measuring means.

4. The semiconductor testing apparatus according to claim 1, wherein the applied voltage source comprises a first DA converter and reversal amplification buffering means, the first DA converter generates a predetermined reference voltage based on set data which is set from the outside, the reversal amplification buffering means is a reversal type operational amplifier for a power, receives the reference voltage, performs reversal amplification upon receiving a test voltage which is supplied to the DUT, and supplies the voltage as the test voltage to the DUT from an output end of the reversal amplification buffering means through the current/voltage converting means, and the voltages are supplied as the common mode voltage and the detection voltage from both ends of the current/voltage converting means to third current measuring means, and the reference voltage generated by the first DA converter is supplied to the third current measuring means.

5. The semiconductor testing apparatus according to claim 2, wherein the first current measuring means comprise offset voltage giving means, an AD converter and data storing means, the offset voltage giving means switches and receives the common mode voltage and the detection voltage in time series, and outputs a first low-voltage signal corresponding to the common mode voltage and a second low-voltage signal corresponding to the detection voltage which are subjected to voltage shift to fall within a predetermined low-voltage range, the AD converter receives the first low-voltage signal and the second low-voltage signal subjected to voltage shift to become low voltages in time series, and outputs first measurement data and second measurement data obtained by performing quantization conversion to each of the signals, and the data storing means is a memory or a register capable of storing at least one set of the first measurement data and the second measurement data.

6. The semiconductor testing apparatus according to claim 2, wherein the first current measuring means comprises first input signal switching means which receives the common mode voltage and the detection voltage of one system which are input to the current measuring means, switches to one of the voltages and outputs the switched voltage to the offset voltage giving means.

7. The semiconductor testing apparatus according to claim 3, wherein the second current measuring means comprises second input signal switching means which receives a plurality of groups of input signals each indicating a set of the common mode voltage and the detection voltage from a plurality of channels, switches to one of the plurality of groups and supplies the switched group to the offset voltage giving means.

8. The semiconductor testing apparatus according to claim 4, wherein the third current measuring means comprises third input signal switching means which receives a plurality of groups of input signals each indicating a set of the common mode voltage and the detection voltage from a plurality of channels, switches to one of the plurality of groups and supplies the switched group to the offset voltage giving means, and which also receives the set voltages from the first DA converters of the plurality of channels, switches to the set voltage of a channel corresponding to the selected common mode voltage or detection voltage and supplies the switched set voltage to the offset voltage giving means.

9. The semiconductor testing apparatus according to claim 5, further comprising:

means for applying gradual voltages to both ends of each of at least the first resistance and the second resistance included in the offset voltage giving means in order to perform measurement before a test of the DUT;

means for specifying a deviation between the obtained non-linear characteristic data of the resistances and an ideal resistance; and means for linearly correcting the common mode voltage and the detection voltage obtained by measuring a current flowing through the DUT based on the specified non-linear characteristics of the resistance so that the non-linear characteristics of the resistance become the ideal resistance.

* * * * *